(12) United States Patent
Akieda et al.

(10) Patent No.: US 11,812,573 B2
(45) Date of Patent: Nov. 7, 2023

(54) ELECTRONIC DEVICE CAPABLE OF AVOIDING SIMULTANEOUS USE OF POWER SUPPLIES HAVING DIFFERENT TERMINAL STRUCTURES FROM EACH OTHER

(71) Applicant: FUJITSU COMPONENT LIMITED, Tokyo (JP)

(72) Inventors: Shinichiro Akieda, Tokyo (JP); Tatsushi Shibuya, Tokyo (JP); Tamotsu Koike, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 17/513,309

(22) Filed: Oct. 28, 2021

(65) Prior Publication Data
US 2022/0295654 A1 Sep. 15, 2022

(30) Foreign Application Priority Data
Mar. 9, 2021 (JP) .................................. 2021-037699

(51) Int. Cl.
H05K 5/02 (2006.01)
(52) U.S. Cl.
CPC ......... H05K 5/0247 (2013.01); H05K 5/0217 (2013.01)
(58) Field of Classification Search
CPC ....... H02J 7/0042; H02J 7/0044; G06F 1/263; G06F 1/1635; H05K 5/0247; H05K 5/0217
See application file for complete search history.

(56) References Cited

U.S. PATENT DOCUMENTS 4,140,957 A   2/1979 Rapp
5,805,440 A * 9/1998 Maeshima ......... H01R 13/6675
                                          363/146

(Continued)

FOREIGN PATENT DOCUMENTS

GB    1419828    12/1975
JP    9-232035    9/1997

(Continued)

OTHER PUBLICATIONS

Extended European Search Report, dated May 6, 2022, in counterpart European Patent Application No. 21205990.1 (6 pp.).

*Primary Examiner* — James Wu
(74) *Attorney, Agent, or Firm* — STAAS & HALSEY LLP (57) ABSTRACT

A touch panel device includes a first conductive film having first and second regions, at least a part of the first conductive film between the first and the second regions being removed, a second conductive film laminated on the first conductive film across a gap, first and second terminals that output signals, a first electrode electrically connected to the first terminal, a second electrode facing the first electrode across the first region, a first resistor provided on the first conductive film in the second region and having a pair of electrodes, the pair of electrodes facing each other across a first resistance region in the first conductive film, one of the electrodes being electrically connected to the second electrode, the other of the electrodes being electrically connected to the second terminal, and a first switch electrically connecting the first conductive film to the second conductive film, in the second region.

6 Claims, 10 Drawing Sheets

(56) References Cited

U.S. PATENT DOCUMENTS

| | | |
|---|---|---|
| 5,955,797 A | 9/1999 | Kim |
| 6,452,362 B1 | 9/2002 | Choo |
| 7,058,295 B2 * | 6/2006 | Nishiwaki .............. G03B 17/02 |
| | | 396/539 |
| 9,260,909 B2 * | 2/2016 | Kaga ...................... H04N 23/51 |
| 11,239,684 B2 * | 2/2022 | Inai ........................ G03B 17/02 |
| 2009/0154148 A1 | 6/2009 | Meyer et al. |

FOREIGN PATENT DOCUMENTS

| | | |
|---|---|---|
| JP | 2006-325343 | 11/2006 |
| JP | 2012-157924 | 8/2012 |

* cited by examiner

ELECTRONIC DEVICE CAPABLE OF AVOIDING SIMULTANEOUS USE OF POWER SUPPLIES HAVING DIFFERENT TERMINAL STRUCTURES FROM EACH OTHER

CROSS-REFERENCE TO RELATED APPLICATION

This application is based upon and claims the benefit of priority of the prior Japanese Patent Application No. 2021-037699 filed on Mar. 9, 2021, the entire contents of which are incorporated herein by reference.

FIELD

A certain aspect of the embodiments is related to an electronic device.

BACKGROUND

There is known a laptop computer having a battery storage unit that stores either a battery pack or an AC adapter (e.g., Patent Document 1: Japanese Laid-open Patent Publication No. 2006-325343). The laptop computer can operate on a power from either the battery pack or the AC adapter. In Patent Document 1, the battery pack and the AC adapter have a common terminal structure. That is, the battery pack and the AC adapter have the same shape, and a main body connection terminal of the battery pack and a connection terminal of the AC adapter are provided at the same location, and both are connected to a connection terminal of the laptop computer.

In addition, there is known an electric tool that drives a motor using an electric power supplied from the battery pack (e.g., Patent Document 2: Japanese Laid-open Patent Publication No. 2012-157924). When the battery pack is removed from the electric tool, a cable and a connector extending from a controller in the electric tool are exposed to the outside. A PC can be connected to the connector via an adapter and a USB cable. Data communication can be performed from the PC to the controller mounted on the electric tool via the USB cable. In Patent Document 2, the USB connection cannot supply the power source for operating the motor of the electric tool, and is used for data transfer.

SUMMARY

According to an aspect of the present invention, there is provided an electronic device capable of operating by a current supplied from a power supply cable or a battery, including: a first terminal configured to supply the current from the power supply cable; a second terminal configured to supply the current from the battery; and a first case having a first storage configured to store the power supply cable inserted into the first terminal and a second storage configured to store the battery in contact with the second terminal, wherein the first storage overlaps with the second storage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

When the power supply by a primary battery and the power supply from the outside by the USB cable are used together in an electronic device, a circuit configuration to protect the backflow of a current for safety measures such as prevention of liquid leakage and ignition is required for the simultaneous power supply of the primary battery and the external power supply. However, since the circuit for protecting the backflow of the current is required, the manufacturing cost of the electronic device increases.

It is an object of the present disclosure to provide an electronic device capable of eliminating the need for the circuit for protecting the backflow of the current and avoiding the simultaneous use of a plurality of power supplies having different terminal structures from each other.

Hereinafter, a description will be given of the present embodiments of the present disclosure with reference to the drawings.

Figure 1A:
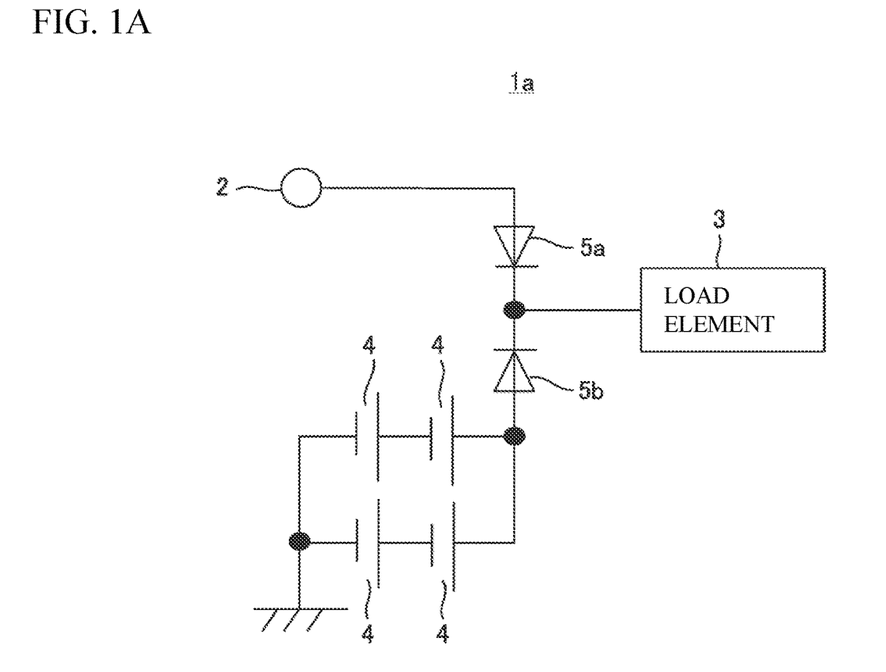
FIG. 1A is a circuit diagram of an electronic device including a backflow protection element.
Figure 1B:
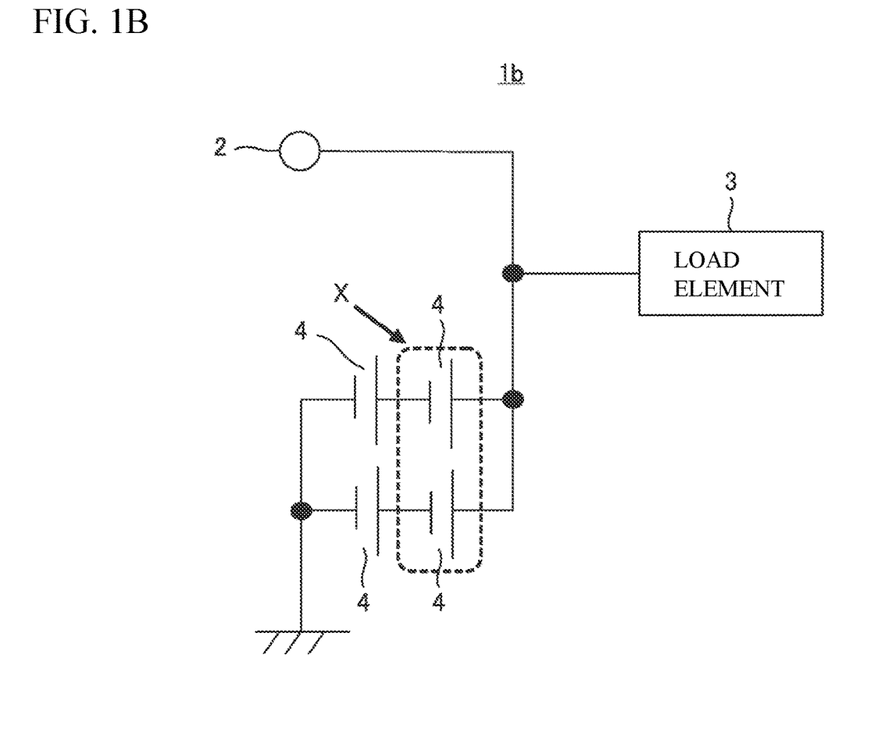
FIG. 1B is a circuit diagram of an electronic device according to a present embodiment.

FIG. 1A is a circuit diagram of an electronic device including a backflow protection element. FIG. 1B is a circuit diagram of an electronic device according to a present embodiment.

An electronic device 1a of FIG. 1A includes a power supply connector 2 (hereinafter referred to simply as "a connector"), a load element 3, batteries 4, and backflow protection elements 5a and 5b. An electronic device 1b according to the present embodiment includes the connector 2, the load element 3, and the batteries 4, but does not include the backflow protection elements 5a and 5b.

Each of the electronic devices 1a and 1b is a device capable of using two or more types of power supply sources such as the connector 2 and the batteries 4, and is a beacon terminal, a mobile printer, a smartphone, a laptop computer, an electric tool, or the like, for example.

The connector 2 is a DC (Direct Current) connector, a USB (Universal Serial Bus) connector, or the like. The load element 3 is a load such as a processor, a memory, various sensors, a wireless module, or a motor. Each of the batteries 4 is, for example, a primary battery capable of only discharging DC power, or a secondary battery that repeatedly charges and discharges. The primary battery is a dry battery, a button battery, or the like. The secondary battery is a lithium ion battery, a nickel-hydrogen storage battery, a nickel-cadmium storage battery, or the like. The number of batteries 4 does not necessarily need to be four, and it is not necessary to connect two batteries 4 in parallel. For example, each of the electronic devices 1a and 1b may be driven by one battery 4.

The backflow protection elements 5a and 5b are diodes, for example. The backflow protection element 5a is connected between the connector 2 and the load element 3 so that the current from the connector 2 flows to the load element 3 and the current from the batteries 4 does not flow to the connector 2. The backflow protection element 5b is connected between the batteries 4 and the load element 3 so that the current from the batteries 4 flows to the load element 3 and the current from the connector 2 does not flow to the batteries 4.

When the drive by the power supply from the batteries 4 and the drive by the external power supply from the connector 2 are used together, the conventional electronic device 1a requires a circuit configuration for preventing the backflow of the current for the simultaneous power supply of the batteries 4 and the connector 2 (external power supply) for safety measures such as prevention of leakage and ignition. In other words, if the current flows back into the batteries 4 or the connector 2, the backflow protection elements 5a and 5b are provided so as to prevent the batteries 4, the connector 2, or the external power supply connected to the connector 2 from failing.

In the electronic device 1b according to the present embodiment, a DC cable or USB cable from the external power source cannot be connected to the connector 2 unless all or a part of the batteries 4 (the two batteries 4 in an area X in the example of FIG. 1B) are removed. Since the selective connection between the batteries 4 and the external power source is physically secured as described above, the backflow protection elements 5a and 5b are not required. Since the batteries 4 and the external power source cannot be used at the same time due to the physical structure of the electronic device 1b, the safety measures can be taken. Also, it is possible to obtain the effects of cost reduction by downsizing the substrate mounted on the electronic device 1b, reducing the weight of the electronic device 1b, and removing the backflow protection elements 5a and 5b.

Hereinafter, a beacon terminal 100 (hereinafter referred to simply as "a terminal") will be described as an example of the electronic device 1b according to the present embodiment. The electronic device according to the present embodiment is not limited to the terminal 100, and may be a mobile printer, a smart phone, a laptop computer, an electric tool or the like.

Figure 2:
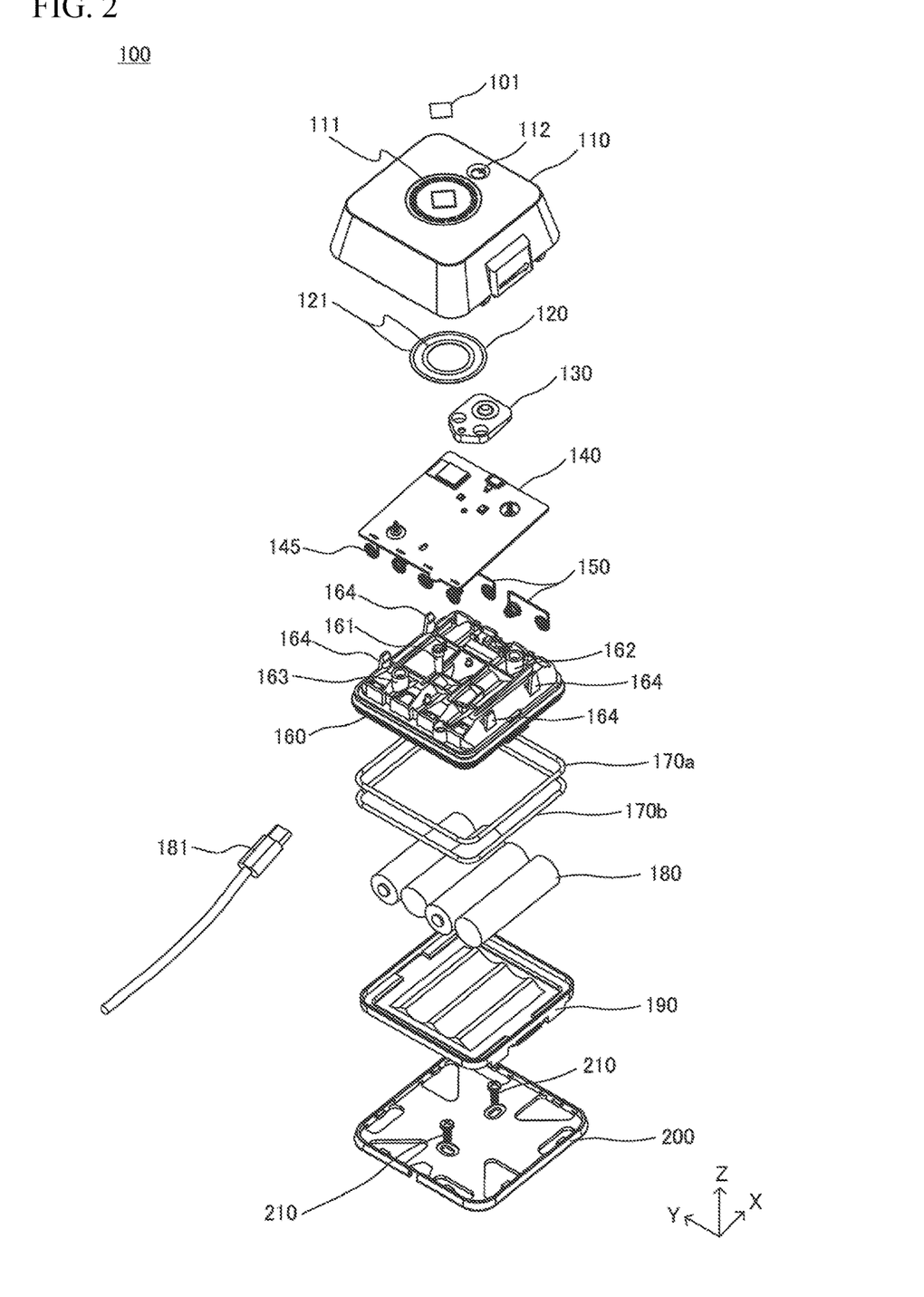
FIG. 2 is an exploded perspective view of a beacon terminal according to a present embodiment.
Figure 3A:
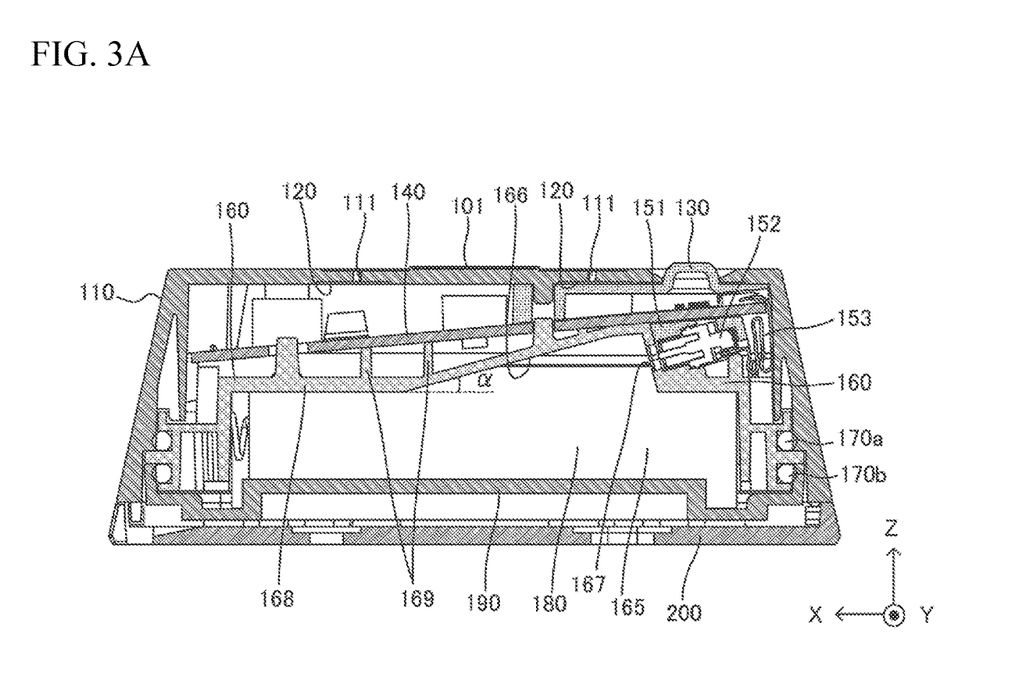
FIG. 3A is a cross-sectional view of the beacon terminal equipped with batteries.
Figure 3B:
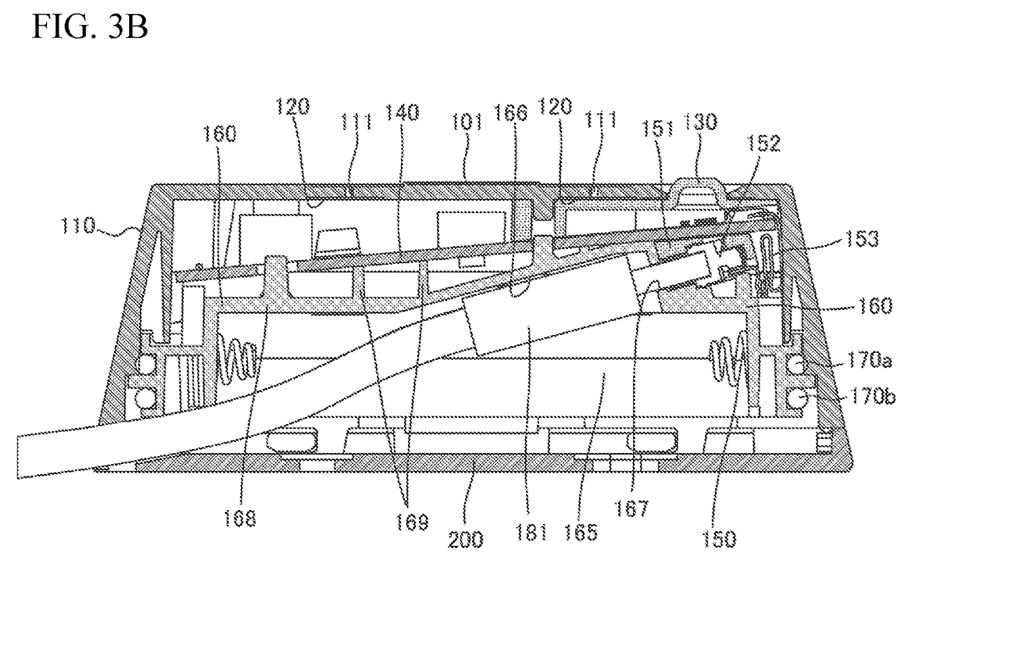
FIG. 3B is a cross-sectional view of the beacon terminal to which a USB cable is connected.

FIG. 2 is an exploded perspective view of the terminal 100 according to the present embodiment. FIG. 3A is a cross-sectional view of the terminal 100 equipped with batteries. FIG. 3B is a cross-sectional view of the terminal 100 to which a USB cable is connected.

The terminal 100 can operate with a current from either batteries 180 or a USB cable 181. The terminal 100 is configured so that the USB cable 181 cannot be connected unless a part of the batteries 180 (two batteries 180 in the middle of FIG. 2) is removed. The batteries 180 is primary batteries or secondary batteries. An external power cable that supplies a direct current (DC) may be connected instead of the USB cable 181. The external power cable such as the USB cable 181 or a DC cable or an AC cable is an example of a power supply cable. If a main body is equipped with a converter, an AC power supply may be connected. In the present embodiment, four batteries 180 are used, and the series connection of the two batteries 180 is used in parallel connection of two lines. Thereby, it can be used for a long period of time (for example, about 5 years) without replacing the batteries.

As illustrated in FIG. 2, the terminal 100 includes a QR (Quick Response) label 101, a top case 110 (a second case), a waterproof and moisture permeable sheet 120 (hereinafter referred to simply as "a sheet"), an LED lens 130, a printed circuit substrate 140, a spring 150, an inner case 160 (a first case), packings 170a and 170b made of a rubber (a first waterproof member and a second waterproof member), a battery cap 190 (hereinafter referred to simply as "a cap"), and a bracket 200. Further, as illustrated in FIGS. 3A and 3B, the terminal 100 includes a stopper anchor 151, a USB connector 152, and a flexible cable 153.

The QR label 101 is a label for identifying the terminal 100, and is attached to the center of an upper surface of the top case 110.

Figure 6:
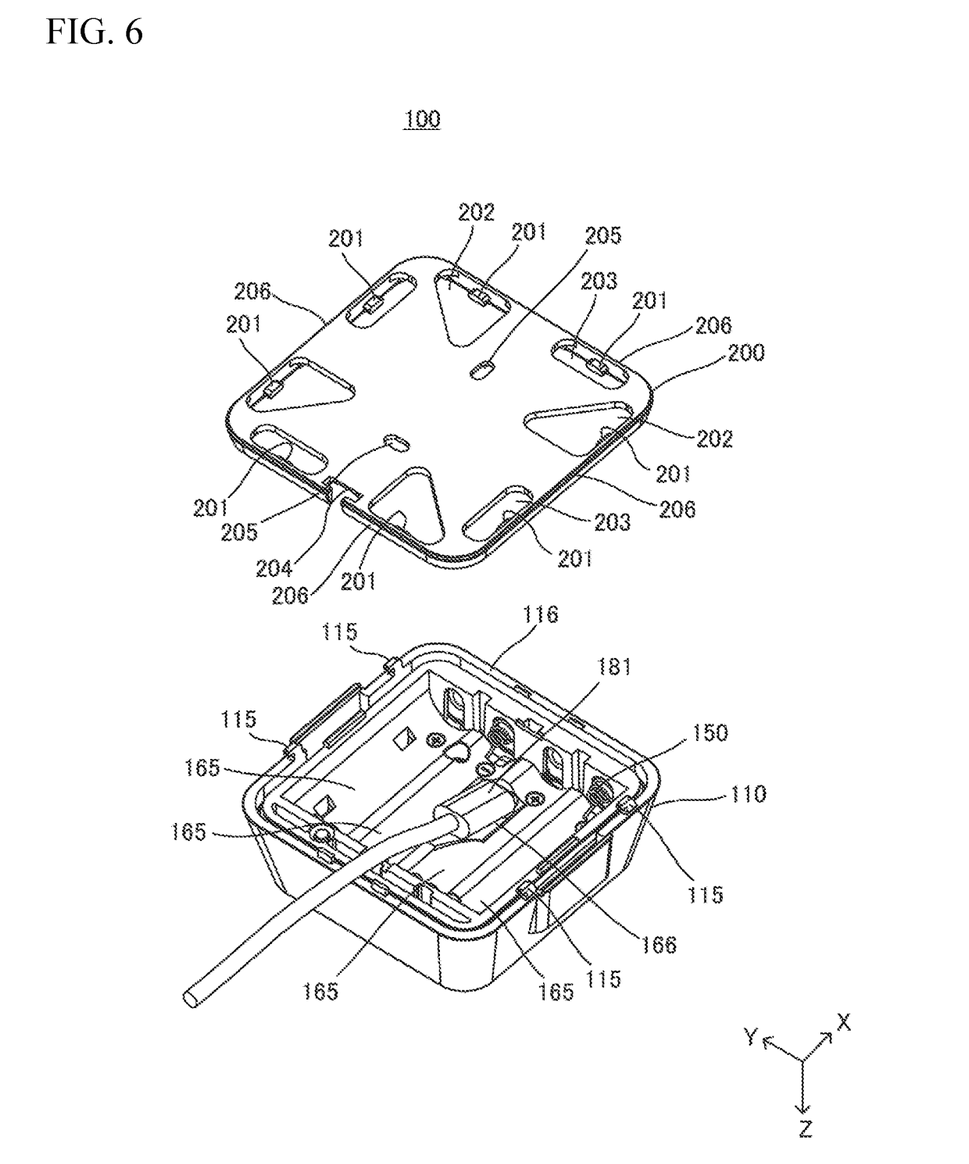
FIG. 6 is a perspective view of the beacon terminal when the USB cable is used.

The top case 110 has a box shape with an opening as illustrated in FIG. 6, and is a waterproof case that covers each element such as the printed circuit substrate 140 and the inner case 160. The upper surface of the top case 110 includes an opening 111 for taking in outside air and an opening 112 for exposing the LED lens 130.

The sheet 120 has an annular shape and is a sheet that allows air and water vapor to pass through but does not allow water to pass through. Double-sided tapes 121 having waterproof performance is provided on the inner and outer circumferences of the sheet 120. The sheet 120 is fixed to the back surface of the top case 110 facing the batteries 180 so as to close the opening 111 with the double-sided tapes 121. Thereby, a temperature and humidity sensor 242 (see FIG. 4A) mounted on the printed circuit substrate 140 can measure a temperature and a humidity of the air that has passed through the sheet 120.

The LED lens 130 is a lens that functions as a transparent window in which an illuminance sensor 244 (see FIG. 4A) mounted on the printed circuit substrate 140 measures the external brightness, and further the transparent window for visually recognizing the light emission of the LED 245 (see FIG. 4A) mounted on the printed circuit substrate 140. A part of the LED lens 130 projects from the opening 112 of the top case 110. The LED lens 130 is fixed to the back surface of the top case 110 with a waterproof double-sided tape (not illustrated).

Figure 4A:
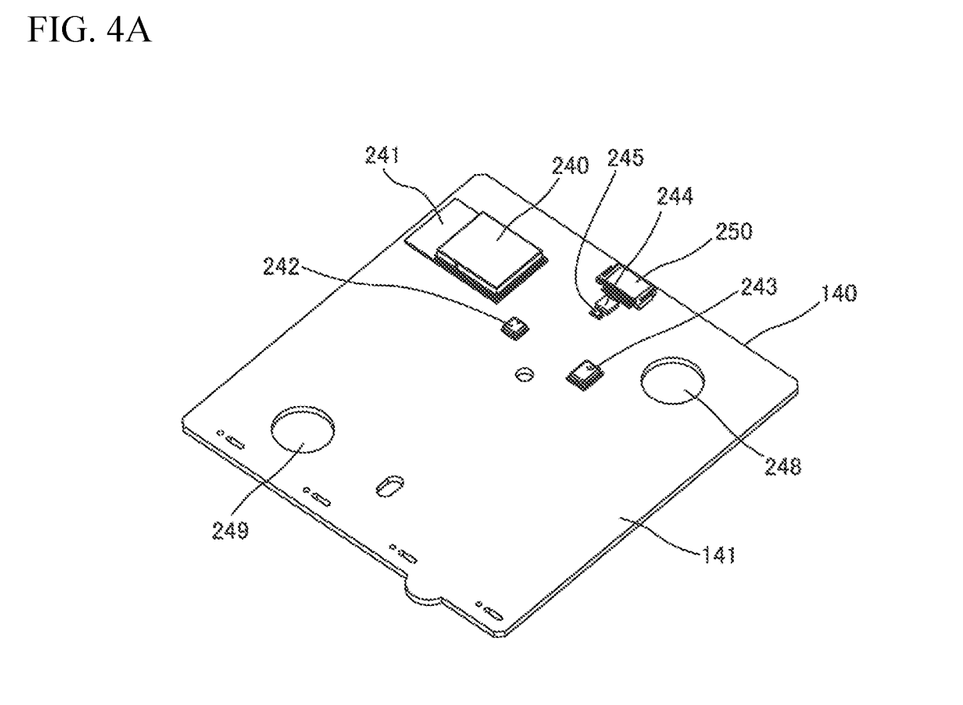
FIG. 4A is a diagram illustrating the configuration of a front surface of a printed circuit substrate.
Figure 4B:
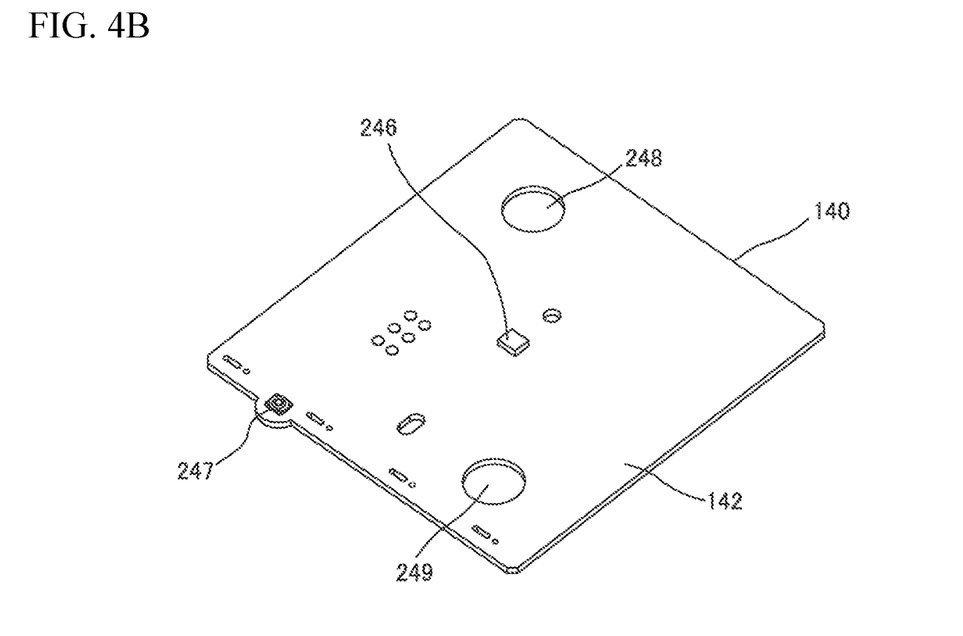
FIG. 4B is a diagram illustrating the configuration of a back surface of the printed circuit substrate.

FIG. 4A is a diagram illustrating the configuration of a front surface of the printed circuit substrate 140. FIG. 4B is a diagram illustrating the configuration of a back surface of the printed circuit substrate 140. A front surface 141 is the upper surface of the printed circuit substrate 140 facing the top case 110 of FIG. 2, and a back surface 142 is a back side of the front surface 141.

A wireless module 240, an antenna 241, a temperature and humidity sensor 242, a noise sensor 243, the illuminance sensor 244, an LED 245, and a cable connection terminal 250 are mounted on the front surface 141. The wireless module 240 and the antenna 241 function as a wireless communication unit that executes wireless communication such as Bluetooth (registered trademark) or wireless LAN to an external device. An acceleration gyro sensor 246 and a tact switch 247 are mounted on the back surface 142. The printed circuit substrate 140 has openings 248 and 249 through which protrusions 162 and 163 (see FIG. 2) of the inner case 160 are penetrated, respectively.

The wireless module 240 outputs a beacon signal via the antenna 241. The temperature and humidity sensor 242 measures the temperature and humidity of the air. The noise sensor 243 measures a noise level. The illuminance sensor 244 converts incident light into a current and measures the brightness. The LED 245 emits light according to various light emitting conditions. The operation of the terminal 100 can be confirmed by light emission from the LED 245. The gyro sensor 246 measures the movement (change in speed) and the rotation of the terminal 100. The tact switch 247 instructs switching of various settings and the like. The cable connection terminal 250 is a terminal for electrically connecting the flexible cable 153 (see FIGS. 3A and 3B) to the printed circuit substrate 140.

Returning to FIG. 2, the spring 150 (second terminal) is an electrode that comes into contact with one end of the batteries 180, is fixed to the inner case 160, and is not connected to the printed circuit substrate 140. A spring 145 (second terminal), which is an electrode that contacts the other end of the batteries 180, is fixed to the printed circuit substrate 140.

A push button 161 is a button for turning on/off the tact switch 247 mounted on the printed circuit substrate 140, and is attached to the inner case 160.

The inner case 160 includes claws 164 for fixing the printed circuit substrate 140. The inner case 160 stores the batteries 180. The inner case 160 is fixed to the top case 110 with screws.

The packing 170a is provided between the top case 110 and the inner case 160. The packing 170a is attached around the side surface of the inner case 160 to prevent the water from entering between the top case 110 and the inner case 160. The packing 170b is provided between the inner case 160 and the cap 190. The packing 170b is attached around the side surface of the inner case 160 to prevent the water from entering between the inner case 160 and the cap 190. That is, the packings 170a and 170b prevent the water from entering the printed circuit substrate 140.

The cap 190 is attached to the top case 110 when the battery 180 is used. When the power source is supplied by the batteries 180, the cap 190 is attached to the inner case 160, so that the waterproof performance can be ensured (see FIG. 3A).

The bracket 200 is used by the user to secure the terminal 100 to a wall or ceiling with screws 210. The bracket 200 is fixed to the wall or ceiling, but the terminal 100 can be removed and attached from/to the bracket 200 by sliding.

The stopper anchor 151 (see FIGS. 3A and 3B) is a block for fixing the USB connector 152 (first terminal) so that the USB connector 152 does not move by the pushing of the USB cable 181 when the USB cable 181 is connected. The flexible cable 153 electrically connects the USB connector 152 to the printed circuit substrate 140.

Figure 5A:
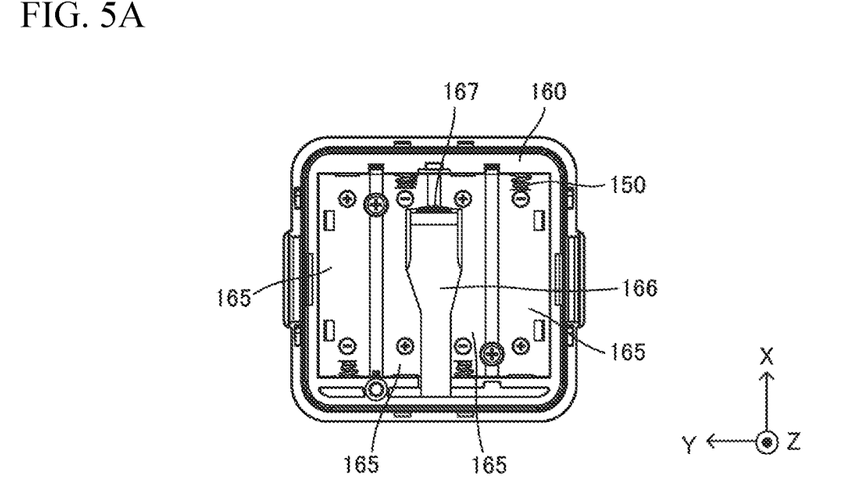
FIG. 5A is a plan view of an inner case.
Figure 5B:
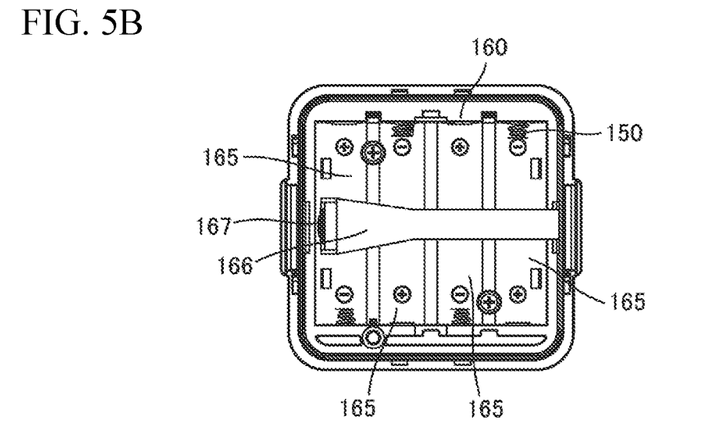
FIG. 5B is a plan view of the inner case according to a first variation.
Figure 5C:
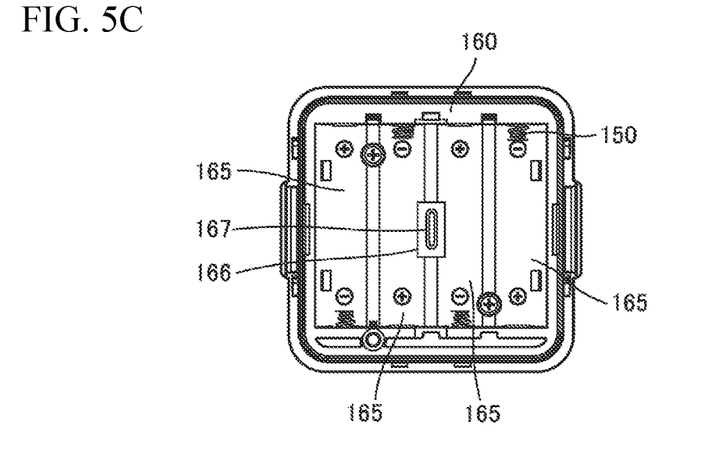
FIG. 5C is a plan view of the inner case according to a second variation.

FIG. 5A is a plan view of the inner case 160. FIG. 5B is a plan view of the inner case 160 according to a first variation. FIG. 5C is a plan view of the inner case 160 according to a second variation. FIGS. 5A to 5C illustrate the structure of the inner case 160 when viewed from a lower side of FIG. 2, i.e., when viewed from the bracket 200.

In FIG. 5A, the inner case 160 includes four battery storage portions 165 (second storage) storing four batteries 180 and a cable storage portion 166 (first storage) storing the USB cable 181. The number of battery storage portions 165 is not limited to four, and may be one or more. The cable storage portion 166 is formed so as to overlap with the two battery storage portions 165 in a plan view. When using the USB cable 181, the batteries need to be removed from at least the two battery storage portions 165 in the middle of the four battery storage portions 165. The cable storage portion 166 should be provided at least at a position where the power supply by the batteries can be cut off when the USB cable 181 is connected. An opening 167 for inserting the USB cable 181 into the USB connector 152 is formed at one end of the cable storage portion 166. Further, the battery storage portion 165 is provided horizontally in FIG. 3A, and the cable storage portion 166 is provided so as to be tilted by an angle α (first angle: for example, 5 degrees or more and 45 degrees or less) with respect to a horizontal surface. That is, the position of the cable storage portion 166 differs from the positions of the battery storage portions 165 not only in the horizontal direction (X and Y directions) but also in the height direction (a Z direction).

In FIG. 5A, the cable storage portion 166 is formed along the X direction, but may be formed along the Y direction as illustrated in FIG. 5B. In this case, the opening 167 is provided on an inner wall of the battery storage portion 165 located on the outermost side, and the USB cable 181 is inserted into the USB connector 152 along the Y direction through the opening 167. Due to this structure, in the example of FIG. 5B, it is necessary to remove all four batteries from the battery storage portions 165 in order to connect the USB cable 181 to the USB connector 152. Further, the opening 167 may be provided on the inner wall of the battery storage portions 165 so as to overlap with a boundary portion between the two battery storage portions 165 located in the middle of the four battery storage portions 165, as illustrated in FIG. 5C. In this case, since the opening 167 houses the tip of the USB cable 181, the cable storage portion 166 is formed around the opening 167. The USB cable 181 is inserted into the USB connector 152 along the Z direction. In the case of this structure, it is necessary to remove at least two batteries located in the middle of the four battery storage portions 165 in order to connect the USB cable 181 to the USB connector 152.

FIG. 6 is a perspective view of the terminal 100 when the USB cable 181 is used. FIG. 6 illustrates the structure of the terminal 100 when viewed from the lower side of FIG. 2.

In FIG. 6, the inner case 160 illustrated in FIG. 5A is used. The inner case 160 includes four battery storage portions 165 and the cable storage portion 166. An outer peripheral edge 116 on the opening side opposite to the upper surface of the top case 110 is provided with four claws 115 that engage with the bracket 200. Two of the claws 115 are provided on each of two opposite sides of the outer peripheral edge 116.

The bracket 200 includes a plurality of protrusions 201 that engage with the claw portion 115, a plurality of through holes 202 and 203 through which cables and the like are passed, a notch 204 through which the USB cable 181 is passed, and a plurality of through holes 205 for screwing the bracket 200. The USB cable 181 may be passed through any of the through holes 202 and 203 instead of the notch 204. The plurality of through holes 202 and 203 function as relief holes that prevent protrusions 191 of the cap 190 described later from coming into contact with the bracket 200. Further, when the bracket 200 is attached to the wall or ceiling, the plurality of through holes 202 and 203 function as wiring openings for connecting the cable drawn from the wall or ceiling to the USB connector 152 or the printed circuit substrate 140.

The plurality of protrusions 201 are provided on each of the inner walls of four side surfaces 206 of the bracket 200. Thereby, the top case 110 can be attached to the bracket 200 even if it is rotated by 90 degrees, 180 degrees, or 270 degrees with respect to the bracket 200.

Figure 7A:
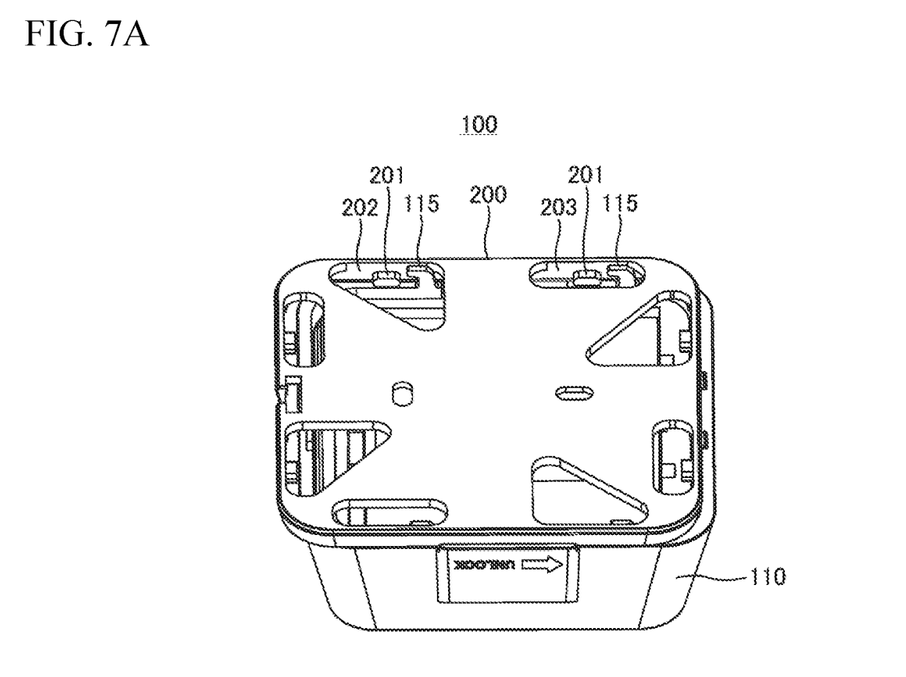
FIG. 7A is a diagram illustrating a state before a top case is attached to a bracket.
Figure 7B:
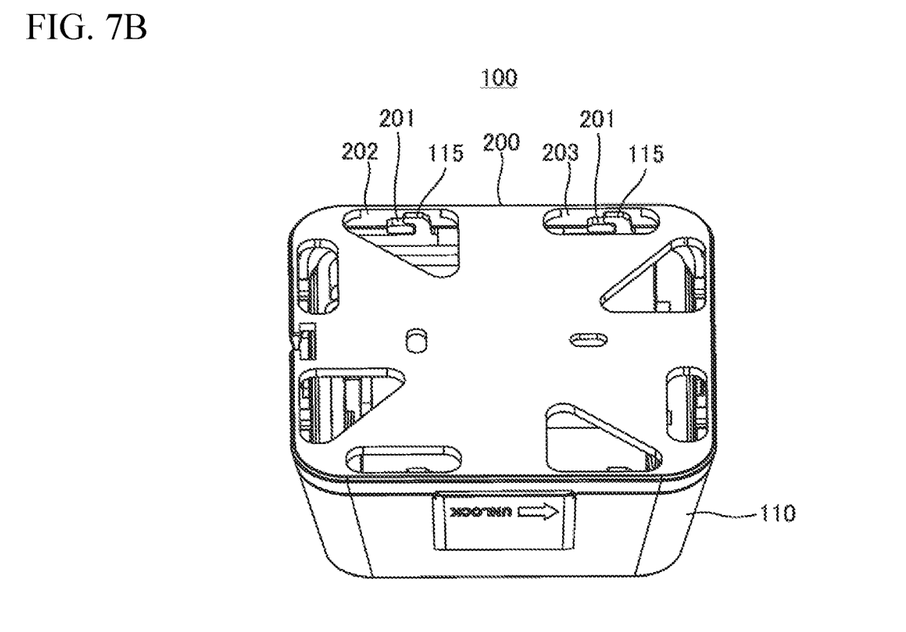
FIG. 7B is a diagram illustrating a state after the top case is attached to the bracket.

FIG. 7A illustrates a state before the top case 110 is attached to the bracket 200. FIG. 7B illustrates a state after the top case 110 is attached to the bracket 200. By sliding the top case 110 to the left direction in FIG. 7A, the claws 115 engage with the protrusions 201, so that the top case 110 can be attached to the bracket 200. No tool or the like is required to attach the top case 110 to the bracket 200. When the top case 110 is removed from the bracket 200, the top case 110 is slid to the right direction in FIG. 7A. Thereby, the claws 115 are released from the protrusions 201, so that the top case 110 can be removed from the bracket 200.

Figure 8:
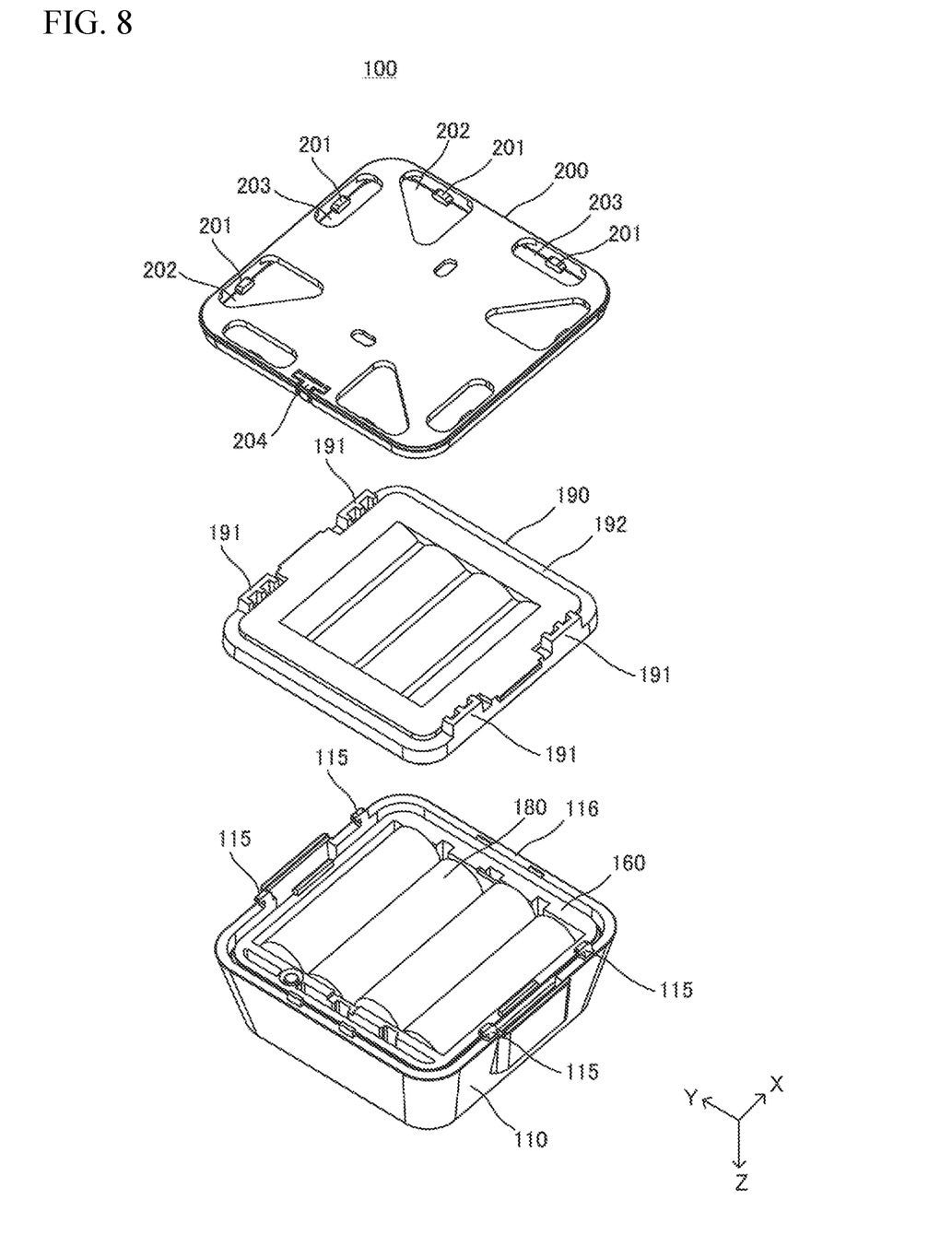
FIG. 8 is a perspective view of the beacon terminal when the batteries are used.
Figure 9:
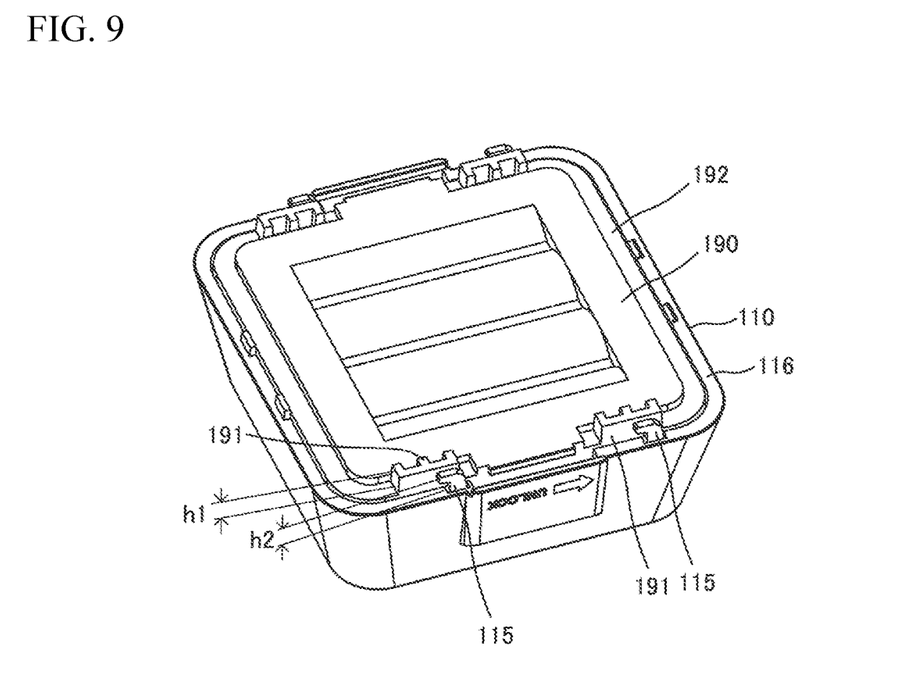
FIG. 9 is a diagram illustrating a state in which a battery cap is attached to the top case.

FIG. 8 is a perspective view of the terminal 100 when the batteries 180 are used. FIG. 8 illustrates the structure of the terminal 100 when viewed from the lower side of FIG. 2. FIG. 9 illustrates a state in which the cap 190 is attached to the top case 110.

Also in FIG. 8, the inner case 160 illustrated in FIG. 5A is used. The structures of the top case 110 and the bracket 200 are the same as those in FIG. 6.

The cap 190 is used to secure the batteries 180 inside the inner case 160. An outer peripheral edge 192 of the cap 190 is provided with four protrusions 191. Two of the protrusions 191 are provided on each of two opposite sides of the outer peripheral edge 192.

As illustrated in FIG. 9, the four protrusions 191 are arranged so as to face the four claws 115, respectively. When the cap 190 is attached to the top case 110, the heights of the outer peripheral edge 116 of the top case 110 and the outer peripheral edge 192 of the cap 190 are substantially the same as each other. A height h1 of the protrusions 191 is set slightly higher (e.g. about 1 mm) than a height h2 of the claws 115.

When the batteries 180 are not installed, the weight of the terminal 100 is light. Therefore, even if the top case 110 is accidentally dropped, the claws 115 do not easily break or bend by hitting the floor. On the other hand, when the batteries 180 are installed, the weight of the terminal 100 becomes heavy. If the top case 110 is dropped in this state, the claws 115 hit the floor, which increases the possibility of their breaking or bending. The height h1 of the protrusions 191 is set slightly higher than the height h2 of the claws 115 of the top case 110 in order to reduce the possibility that the claws 115 break or bend by hitting the floor.

Figure 10:
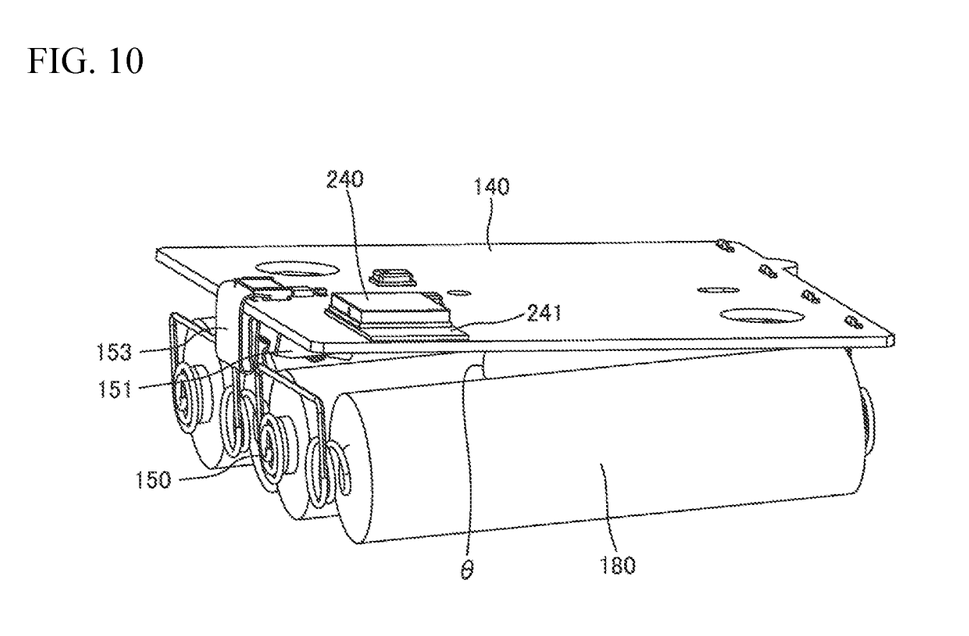
FIG. 10 is a diagram illustrating a positional relationship between the batteries and the printed circuit substrate.

FIG. 10 is a diagram illustrating a positional relationship between the batteries 180 and the printed circuit substrate 40. In FIG. 10, the inner case 160 is omitted.

As illustrated in FIG. 10, the printed circuit substrate 140 is tilted by an angle θ (second angle: for example, 5 degrees or more) with respect to the batteries 180 so that the wireless module 240 and the antenna 241 mounted on the printed circuit substrate 140 are separated from the batteries 180. If the battery 180, which is a conductor, gets too close to the wireless module 240 and the antenna 241, the wireless antenna characteristics deteriorate. Therefore, the printed circuit substrate 140 is tilted with respect to the batteries 180 by the angle θ so that the wireless module 240 and the antenna 241 are separated from the batteries 180 (conductor). Thereby, the deterioration of the wireless antenna characteristics can be suppressed.

As illustrated in FIGS. 3A and 3B, ribs 169 are provided on a surface 168 of the inner case 160 facing the printed circuit substrate 140 so that the printed circuit substrate 140 is tilted by the angle θ with respect to the batteries 180. This also makes it possible to suppress the deterioration of the wireless antenna characteristics. The printed circuit substrate 140 is supported from the lower side by a part of the surface 168 and the ribs 169 so as to be tilted by the angle θ, and is fixed from the upper side by the claws 164 (see FIG. 2) of the inner case 160.

As described above, the terminal 100 according to the present embodiment includes the inner case 160 having the cable storage portion 166 that stores the USB cable 181 inserted into the USB connector 152, and the battery storage portions 165 that store the batteries 180 in contact with the springs 145 and 150. In the plan view, the cable storage portion 166 is formed so as to overlap with the battery storage portions 165. As a result, when the USB cable 181 is inserted into the USB connector 152, the USB cable 181 overlaps with the positions of the batteries 180. For this reason, the USB cable 181 from the external power source cannot be connected to the USB connector 152 unless all or the part of the batteries 180 (e.g. two middle batteries 180 in the example of FIGS. 5A and 5C, or all batteries 180 in the example of FIG. 5B) are removed. In this way, since the selective connection between the batteries 180 and the external power source is physically secured, the backflow protection element is not required. Since the batteries 180 and the external power source cannot be used at the same time due to the physical structure of the terminal 100, the safety measures such as prevention of liquid leakage and ignition can be taken. Further, it is possible to obtain the effects of cost reduction by downsizing the printed circuit substrate 140, reducing the weight of the terminal 100, and reducing the number of backflow protection elements.

Further, although the cable storage portion 166 overlaps with the battery storage portions 165 in the plan view, the positions of the cable storage portion 166 or the USB connector 152 differ from the position of the battery storage portions 165 in the height direction of the terminal 100 (see FIGS. 3A and 3B). As a result, when the USB cable 181 is connected to the USB connector 152, the USB cable 181 crosses the battery storage portions 165. Therefore, the physical structure of the terminal 100 makes it possible to avoid the simultaneous use of the batteries 180 and the external power source. Similarly, the cable storage portion 166 overlaps with the battery storage portions 165 in the plan view, but the cable storage portion 166 or the USB connector 152 is provided so as to be tilted by a first angle with respect to the battery storage portions 165 (see FIGS. 3A and 3B). As a result, when the USB cable 181 is connected to the USB connector 152, the USB cable 181 crosses the battery storage portions 165. Therefore, the physical structure of the terminal 100 makes it possible to avoid the simultaneous use of the batteries 180 and the external power source.

According to the present embodiment, the printed circuit substrate 140 is tilted by the angle θ with respect to the batteries 180 stored in the battery storage portions 165 so that the wireless module 240 and the antenna 241 are separated from the batteries 180. Thereby, the deterioration of the wireless antenna characteristics can be suppressed.

Further, the ribs 169 are provided on the surface 168 of the inner case 160 facing the printed circuit substrate 140 so that the printed circuit substrate 140 is tilted by the angle θ with respect to the batteries 180. This also makes it possible to suppress the deterioration of the wireless antenna characteristics.

According to the present embodiment, the protrusions 201 are provided on each side surface of the bracket 200, and claws 115 that engage with the protrusions 201 are provided on two opposite sides of the outer peripheral edge 116 of the top case 110. Thereby, the top case 110 can be attached to the bracket 200 even if it is rotated by 90 degrees, 180 degrees, or 270 degrees with respect to the bracket 200.

Further, according to the present embodiment, the outer peripheral edge 116 of the top case 110 is provided with the claws 115, and the outer peripheral edge 192 of the cap 190 is provided with the protrusions 191. The height h1 of the protrusions 191 is higher than the height h2 of the claws 115. Therefore, when the top case 110 is dropped, it is possible to reduce the possibility that the claws 115 of the top case 110 break or bend by hitting the floor.

Further, according to the present embodiment, the packing 170*a* is arranged between the inner case 160 and the top case 110, and the packing 170*b* is arranged between the inner case 160 and the cap 190. Therefore, it is possible to prevent the water from entering between the inner case 160 and the top case 110 and between the inner case 160 and the cap 190.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An electronic device capable of operating by a current supplied from a power supply cable or a battery, comprising:
   a first terminal configured to supply the current from the power supply cable;
   a second terminal configured to supply the current from the battery; and
   a first case having a first storage configured to store the power supply cable inserted into the first terminal and a second storage configured to store the battery in contact with the second terminal;
   wherein the first storage overlaps with the second storage,
   an opening for connecting the power supply cable to the first terminal is provided on an inner wall of the second storage, and
   the second terminal is a pair of terminals that is connectable to both ends of the battery stored in the second storage and is provided separately from the first terminal.

2. The electronic device as claimed in claim 1, wherein a position of the first terminal differs from that of the second storage in a height direction of the electronic device.

3. The electronic device as claimed in claim 1, wherein the first terminal is tilted by a first angle with respect to the second storage.

4. The electronic device as claimed in claim 1, further comprising:
   a substrate having a wireless communicator configured to perform wireless communication with an external device;
   wherein the substrate is tilted by a second angle with respect to the battery stored in the second storage so that the wireless communicator is separated from the battery.

5. An electronic device capable of operating by a current supplied from a power supply cable or a battery, comprising:
   a first terminal configured to supply the current from the power supply cable;
   a second terminal configured to supply the current from the battery; and
   a first case having a first storage configured to store the power supply cable inserted into the first terminal and a second storage configured to store the battery in contact with the second terminal, wherein the first storage overlaps with the second storage;
   a second case configured to cover the first terminal, the second terminal, and the first case; and
   a bracket attached to the second case;
   wherein a protrusion is provided on each of side surfaces of the bracket, and
   a claw that engages with the protrusion is provided on each of two opposing sides of an outer peripheral edge of the second case.

6. An electronic device capable of operating by a current supplied from a power supply cable or a battery, comprising:
   a first terminal configured to supply the current from the power supply cable;
   a second terminal configured to supply the current from the battery; and
   a first case having a first storage configured to store the power supply cable inserted into the first terminal and a second storage configured to store the battery in contact with the second terminal, wherein the first storage overlaps with the second storage;
   a second case configured to cover the first terminal, the second terminal, and the first case; and
   a cap configured to fix the battery in the second storage;
   wherein a claw is provided on an outer peripheral edge of the second case,
   a protrusion is provided on an outer peripheral edge of the cap, and
   a height of the protrusion is more than that of the claw.

* * * * *